(12) United States Patent
Spindler et al.

(10) Patent No.: US 7,948,165 B2
(45) Date of Patent: May 24, 2011

(54) HIGH-PERFORMANCE TANDEM WHITE OLED

(75) Inventors: Jeffrey P. Spindler, Rochester, NY (US); Tukaram K. Hatwar, Penfield, NY (US)

(73) Assignee: Global OLED Technology LLC, Herndon, VA (US)

( * ) Notice: Subject to any disclaimer, the term of this patent is extended or adjusted under 35 U.S.C. 154(b) by 630 days.

(21) Appl. No.: 11/746,290

(22) Filed: May 9, 2007

(65) Prior Publication Data

US 2008/0278066 A1  Nov. 13, 2008

(51) Int. Cl.
*H01L 51/50* (2006.01)
(52) U.S. Cl. .......................... 313/504; 313/506; 428/690
(58) Field of Classification Search .................. 313/504; 428/690
See application file for complete search history.

(56) References Cited

U.S. PATENT DOCUMENTS

| | | | |
|---|---|---|---|
| 4,769,292 A | 9/1988 | Tang et al. | |
| 4,885,211 A | 12/1989 | Tang et al. | |
| 5,683,823 A | 11/1997 | Shi et al. | |
| 6,107,734 A | 8/2000 | Tanaka et al. | |
| 6,337,492 B1 | 1/2002 | Jones et al. | |
| 6,717,358 B1 | 4/2004 | Liao et al. | |
| 2003/0072966 A1* | 4/2003 | Hosokawa et al. | 428/690 |
| 2003/0170491 A1* | 9/2003 | Liao et al. | 428/690 |
| 2003/0189401 A1 | 10/2003 | Kido et al. | |
| 2004/0001968 A1 | 1/2004 | Hatwar et al. | |
| 2005/0104511 A1* | 5/2005 | Liao et al. | 313/504 |
| 2005/0206305 A1 | 9/2005 | Masuda et al. | |
| 2005/0260442 A1 | 11/2005 | Yu et al. | |
| 2006/0003184 A1* | 1/2006 | Hatwar et al. | 428/690 |

FOREIGN PATENT DOCUMENTS

| | | |
|---|---|---|
| JP | 07-142169 | 6/1995 |
| JP | 2003-045676 | 2/2003 |
| JP | 2006-324016 | 11/2006 |
| WO | 2005/115059 | 12/2005 |

OTHER PUBLICATIONS

Tokito et al., Appl. Phys. Ltrs.; vol. 83, No. 12, Sep. 22, 2003, pp. 2459-2461; High-Efficiency White Phosphorescent Organic Light-Emitting Devices With Greenish-Blue and Red-Emitting Layers.
Matsumoto et al., SID 03 Digest, pp. 979-981; 27.5L: Late-News Paper: Multiphotoon Organic El Device Having Charge Generation Layer.
Kido et al., Appl. Phys. Ltr. 64 (7), Feb. 14, 1994, pp. 815-817; White Light-Emitting Orgnic Electroluminescent Devices Using The Poly (N-Vinylcarbazle) Emitter Layer Doped With Three Fluorescent Dyes.
Deshpande et al., Appl. Phys. Ltr. 75 ; vol. 7, 888-890; (1999) White Light-Emitting Orgnic Electroluminescent Devices Based on Interlayer Sequential Energy Transfer.

* cited by examiner

*Primary Examiner* — Nimeshkumar D Patel
*Assistant Examiner* — Mary Ellen Bowman
(74) *Attorney, Agent, or Firm* — Morgan, Lewis & Bockius LLP (57) ABSTRACT

A tandem OLED device having two spaced electrodes comprising: first and second light-emitting units that produce different emission spectra disposed between the electrodes, the first light-emitting unit produces light that has multiple peaks at wavelengths longer than 500 nm and substantially no emission at wavelengths shorter than 480 nm, and the second light-emitting unit produces light that has substantial emission at wavelengths shorter than 500 nm; and an intermediate connector disposed between the light-emitting units.

9 Claims, 3 Drawing Sheets

HIGH-PERFORMANCE TANDEM WHITE OLED

CROSS REFERENCE TO RELATED APPLICATIONS

Reference is made to commonly assigned U.S. Ser. No. 11/741,911, filed Apr. 30, 2007, entitled White Light Tandem OLED by Spindler et al.; U.S. Ser. No. 11/595,199, filed Nov. 10, 2006, entitled Display With RGB Color Filter Element Sets by Helber et al.; U.S. Ser. No. 11/668,515, filed Jan. 30, 2007, entitled OLEDS Having High Efficiency And Excellent Lifetime, by Klubek et al.; U.S. Ser. No. 11/393,316, filed Mar. 30, 2006, entitled OLED Device With Improved Efficiency And Lifetime by Spindler et al.; and U.S. Ser. No. 11/393,767, filed Mar. 30, 2006, entitled Efficient White-Light OLED Display With Filters by Hatwar et al.; the disclosures of which are incorporated herein by reference.

FIELD OF THE INVENTION

The present invention relates to broadband light-producing OLED displays.

BACKGROUND OF THE INVENTION

An organic light-emitting diode device, also called an OLED, commonly includes an anode, a cathode, and an organic electroluminescent (EL) unit sandwiched between the anode and the cathode. The organic EL unit includes at least a hole-transporting layer (HTL), a light-emitting layer (LEL), and an electron-transporting layer (ETL). OLEDs are attractive because of their low drive voltage, high luminance, wide viewing-angle, and capability for full color displays and for other applications. Tang et al. described this multilayer OLED in their U.S. Pat. Nos. 4,769,292 and 4,885,211.

OLEDs can emit different colors, such as red, green, blue, or white, depending on the emitting property of its LEL. Recently, there is an increasing demand for broadband OLEDs to be incorporated into various applications, such as a solid-state lighting source, color display, or a full color display. By broadband emission, it is meant that an OLED emits sufficiently broad light throughout the visible spectrum so that such light can be used in conjunction with filters or color change modules to produce displays with at least two different colors or a full color display. In particular, there is a need for broadband-light-emitting OLEDs (or broadband OLEDs) where there is substantial emission in the red, green, and blue portions of the spectrum, i.e., a white light-emitting OLED (white OLED). The use of white OLEDs with color filters provides a simpler manufacturing process than an OLED having separately patterned red, green, and blue emitters. This can result in higher throughput, increased yield, and cost savings. White OLEDs have been reported, e.g. by Kido et al. in *Applied Physics Letters*, 64, 815 (1994), J. Shi et al. in U.S. Pat. No. 5,683,823, Sato et al. in JP 07-142169, Deshpande et al. in *Applied Physics Letters*, 75, 888 (1999), and Tokito, et al. in *Applied Physics Letters*, 83, 2459 (2003).

In order to achieve broadband emission from an OLED, more than one type of molecule has to be excited, because each type of molecule only emits light with a relatively narrow spectrum under normal conditions. A light-emitting layer having a host material and one or more luminescent dopant(s) can achieve light emission from both the host and the dopant(s) resulting in a broadband emission in the visible spectrum if the energy transfer from the host material to the dopant(s) is incomplete. To achieve a white OLED having a single light-emitting layer, the concentrations of light-emitting dopants must be carefully controlled. This produces manufacturing difficulties. A white OLED having two or more light-emitting layers can have better color and better luminance efficiency than a device with one light-emitting layer, and the variability tolerance for dopant concentration is higher. It has also been found that white OLEDs having two light-emitting layers are typically more stable than OLEDs having a single light-emitting layer. However, it is difficult to achieve light emission with strong intensity in the red, green, and blue portions of the spectrum. A white OLED with two light-emitting layers typically has two intensive emission peaks.

A tandem OLED structure (sometimes called a stacked OLED or a cascaded OLED) has been disclosed by Jones et al. in U.S. Pat. No. 6,337,492, Tanaka et al. in U.S. Pat. No. 6,107,734, Kido et al. in JP Patent Publication 2003/045676A and U.S. Patent Publication 2003/0189401 A1, and Liao et al. in U.S. Pat. No. 6,717,358 and U.S. Patent Application Publication 2003/0170491 A1. This tandem OLED is fabricated by stacking several individual OLED units vertically and driving the stack using a single power source. The advantage is that luminance efficiency, lifetime, or both are increased. However, the tandem structure increases the driving voltage approximately in proportion to the number of OLED units stacked together.

Matsumoto and Kido et al. reported in *SID 03 Digest*, 979 (2003) that a tandem white OLED is constructed by connecting a greenish blue EL unit and an orange EL unit in the device, and white light emission is achieved by driving this device with a single power source. Although luminance efficiency is increased, this tandem white OLED device has weaker green and red color components in the spectrum. In U.S. Patent Application Publication 2003/0170491 A1, Liao et al. describe a tandem white OLED structure by connecting a red EL unit, a green EL unit, and a blue EL unit in series within the device. When the tandem white OLED is driven by a single power source, white light emission is formed by spectral combination from the red, green, and blue EL units. Although color emission and luminance efficiency is improved, this tandem white OLED cannot be made with less than three EL units, implying a drive voltage at least 3 times as high as that of a conventional OLED.

Notwithstanding these developments, there remains a need to improve efficiency and luminance stability of OLED devices.

SUMMARY OF THE INVENTION

It is therefore an object of the present invention to provide an OLED device with improved efficiency and luminance stability.

This object is achieved by a tandem OLED device having two spaced electrodes comprising:
  a) first and second light-emitting units that produce different emission spectra disposed between the electrodes, the first light-emitting unit produces light that has multiple peaks at wavelengths longer than 500 nm and substantially no emission at wavelengths shorter than 480 nm, and the second light-emitting unit produces light that has substantial emission at wavelengths shorter than 500 nm; and
  b) an intermediate connector disposed between the light-emitting units.

ADVANTAGES

It is an advantage of this invention that it provides improved efficiency for an OLED display, which is suitable for broadband applications. It is a further advantage of this invention that it provides improved luminance stability of the display. It is a further advantage of this invention that it can provide these improvements with good lifetime, low power consumption, and good color tunability.

Since device feature dimensions such as layer thicknesses are frequently in sub-micrometer ranges, the drawings are scaled for ease of visualization rather than dimensional accuracy.

DETAILED DESCRIPTION OF THE INVENTION

The term "OLED device" is used in its art-recognized meaning of a display device comprising organic light-emitting diodes as pixels. It can mean a device having a single pixel. The term "OLED display" as used herein means an OLED device comprising a plurality of pixels, which can be of different colors. A color OLED device emits light of at least one color. The term "multicolor" is employed to describe a display panel that is capable of emitting light of a different hue in different areas. In particular, it is employed to describe a display panel that is capable of displaying images of different colors. These areas are not necessarily contiguous. The term "full color" is employed to describe multicolor display panels that are capable of emitting in the red, green, and blue regions of the visible spectrum and displaying images in any combination of hues. The red, green, and blue colors constitute the three primary colors from which all other colors can be generated by appropriate mixing. The term "hue" refers to the intensity profile of light emission within the visible spectrum, with different hues exhibiting visually discernible differences in color. The term "pixel" is employed in its art-recognized usage to designate an area of a display panel that is stimulated to emit light independently of other areas. It is recognized that in full color systems, several pixels of different colors will be used together to produce a wide range of colors, and a viewer can term such a group a single pixel. For the purposes of this discussion, such a group will be considered several different colored pixels.

In accordance with this disclosure, broadband emission is light that has significant components in multiple portions of the visible spectrum, for example, blue and green. Broadband emission can also include the situation where light is emitted in the red, green, and blue portions of the spectrum in order to produce white light. White light is that light that is perceived by a user as having a white color, or light that has an emission spectrum sufficient to be used in combination with color filters to produce a practical full color display. For low power consumption, it is often advantageous for the chromaticity of the white light-emitting OLED to be close to CIE $D_{65}$, i.e., CIEx=0.31 and CIEy=0.33. This is particularly the case for so-called RGBW displays having red, green, blue, and white pixels. Although CIEx, CIEy coordinates of about 0.31, 0.33 are ideal in some circumstances; the actual coordinates can vary significantly and still be very useful. The term "white light-emitting" as used herein refers to a device that produces white light internally, even though part of such light can be removed by color filters before viewing.

Figure 1:
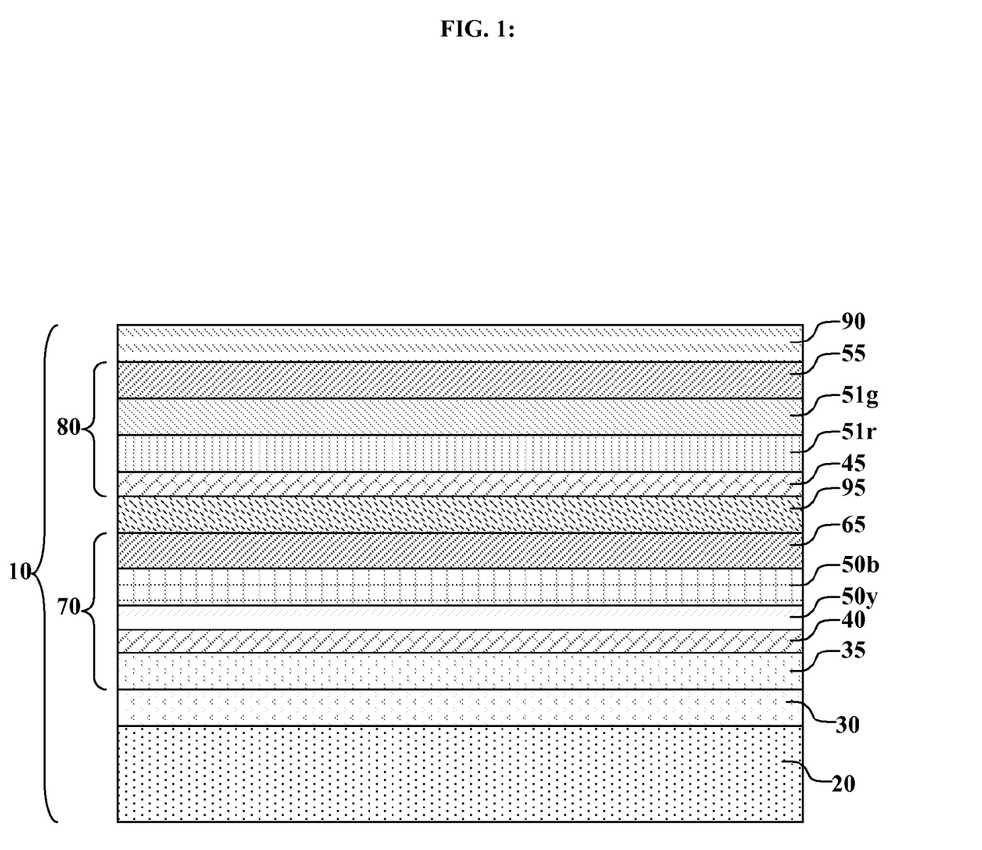
FIG. 1 shows a cross-sectional view of one embodiment of a tandem OLED device in accordance with this invention.

Turning now to FIG. 1, there is shown a cross-sectional view of a pixel of a tandem white-light-emitting OLED device 10 according to one embodiment of the present invention. OLED device 10 includes a substrate 20, two spaced electrodes, which are anode 30 and cathode 90, first and second light-emitting units 80 and 70 disposed between the electrodes, and an intermediate connector 95 disposed between light-emitting units 70 and 80. In U.S. Ser. No. 11/393,767, Hatwar et al. describes the use of multiple light-emitting units of this arrangement. Light-emitting units 70 and 80 each produce different emission spectra. First light-emitting unit 80 produces light that has multiple peaks at wavelengths longer than 500 nm, e.g. in the green, yellow, and red regions of the visible spectrum. First light emitting unit 80 produces substantially no blue emission, meaning that the emission intensity at wavelengths shorter than 480 nm is less than 10% of the maximum emission intensity, and no more than 50% at 490 nm. In this embodiment, first light-emitting unit 80 includes a first light-emitting layer, e.g. green light-emitting layer 51g that includes a green light-emitting compound and produces green emission. First light-emitting unit 80 further includes a second light-emitting layer, e.g. red light-emitting layer 51r that includes a red light-emitting compound and produces red emission. Second light-emitting unit 70 produces light that has substantial emission at wavelengths shorter than 500 nm. Second light-emitting unit 70 can have emission at other wavelengths as well. In this embodiment, second light-emitting unit 70 includes blue light-emitting layer 50b that includes a blue light-emitting compound and yellow light-emitting layer 50y that includes a yellow light-emitting compound. As used herein, the term "yellow light-emitting compound" refers to a substance that has its primary light emission in the yellow to red region, that is, from about 570 nm to 700 nm. Light-emitting unit 80 includes electron-transporting layer 55 and hole-transporting layer 45. Light-emitting unit 70 includes electron-transporting layer 65.

Tandem OLED device 10 further includes an intermediate connector 95 disposed between light-emitting units 70 and 80. The intermediate connector provides effective carrier injection into the adjacent EL units. Metals, metal compounds, or other inorganic compounds are effective for carrier injection. However, such materials often have low resistivity, which can result in pixel crosstalk. Also, the optical transparency of the layers constituting intermediate connector 95 should be selected to permit for radiation produced in the EL units to exit the device. Therefore, it is often preferred to use mainly organic materials in the intermediate connector. Intermediate connector 95 and materials used in its construction, have been described in detail, in U.S. Patent Application Publication 2007/0001587. Some further nonlimiting examples of intermediate connectors are described in U.S. Pat. Nos. 6,717,358 and 6,872,472, and U.S. Patent Application Publication 2004/0227460.

Figure 2:
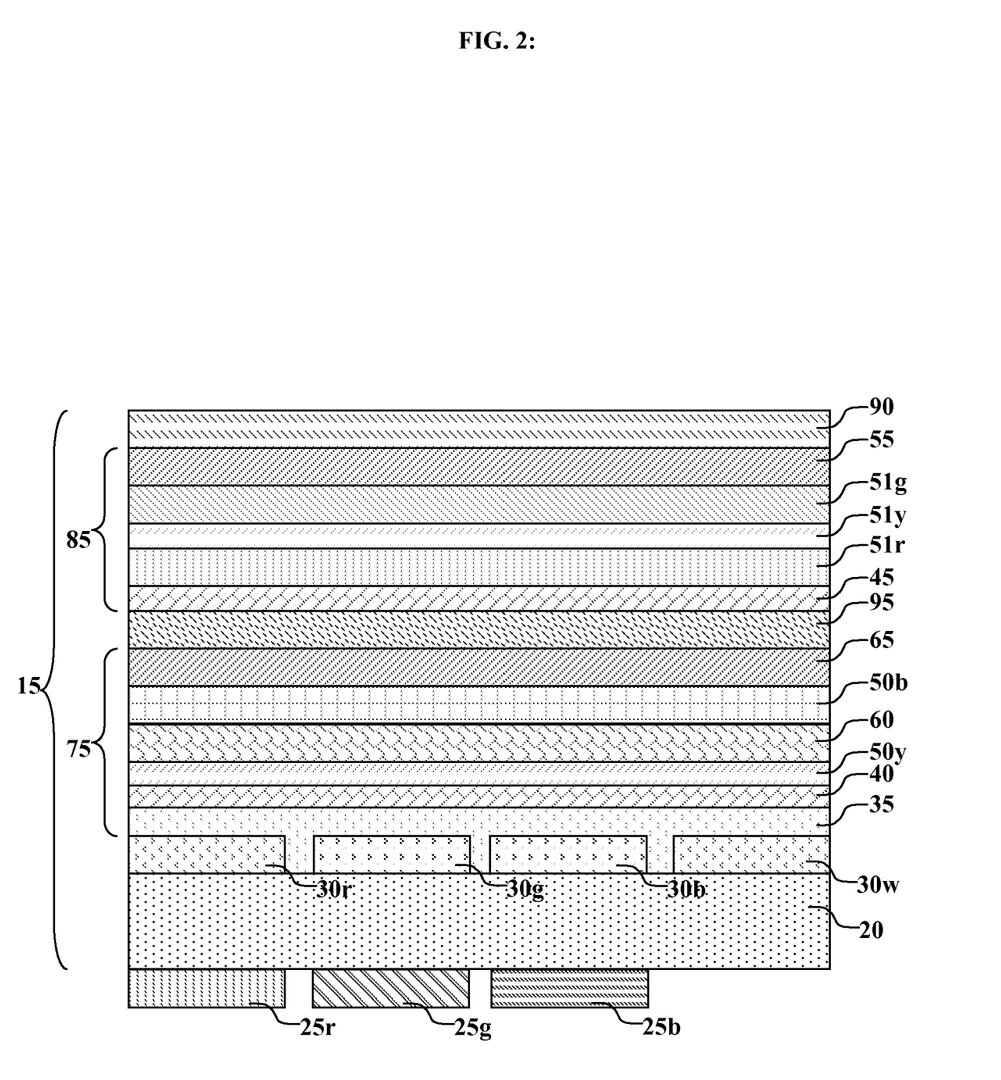
FIG. 2 shows a cross-sectional view of another embodiment of a tandem OLED device in accordance with this invention.

Turning now to FIG. 2, there is shown a cross-sectional view of another embodiment of a tandem OLED device 15 in accordance with this invention. In this embodiment, first light-emitting unit 85 additionally includes a third light-emitting layer, e.g. yellow light-emitting layer 51y that includes a yellow light-emitting compound and produces yellow emission. The third light-emitting layer is in contact with the first and second light-emitting layers. Second light-emitting unit 75 additionally includes spacer layer 60 disposed between blue light-emitting layer 50b and yellow light-emitting layer 50y. A spacer layer 60 is used to provide high efficiency and high stability blue emission. Spindler et al. also use a spacer layer to provide high-efficiency and high-stability blue emission, as described in U.S. Ser. No. 11/393,316. Without yellow light-emitting layer 50y, blue light-emitting layer 50b would have inferior stability. With yellow light-emitting layer 50y as an adjacent layer, this unit would function as a white emitter. The presence of spacer layer 60 increases blue emission while reducing yellow emission, giving it substantially blue emission while maintaining the luminance stability of the white emitter. Alternatively, yellow light-emitting layer 50y can be replaced by red or green light emitting layers.

OLED device 15 further includes associated with it an array of at least three different color filters, the bandpass of each of which is selected to produce different colored light, e.g. red color filter 25r, green color filter 25g, and blue color filter 25b, which produce red, green, and blue light, respectively. Each color filter of the array receives light from the light-emitting units, e.g. first and second light-emitting units 85 and 75, and thereby produces different colored light through each filter. Each color filter has an associated anode, e.g. anodes 30r, 30g, and 30b, for selectively producing desired colors of light. OLED device 15 can also have non-filtered areas, e.g. that of anode 30w, which has no color filter and therefore allows emission of broadband light produced by OLED device 15.

Figure 3:
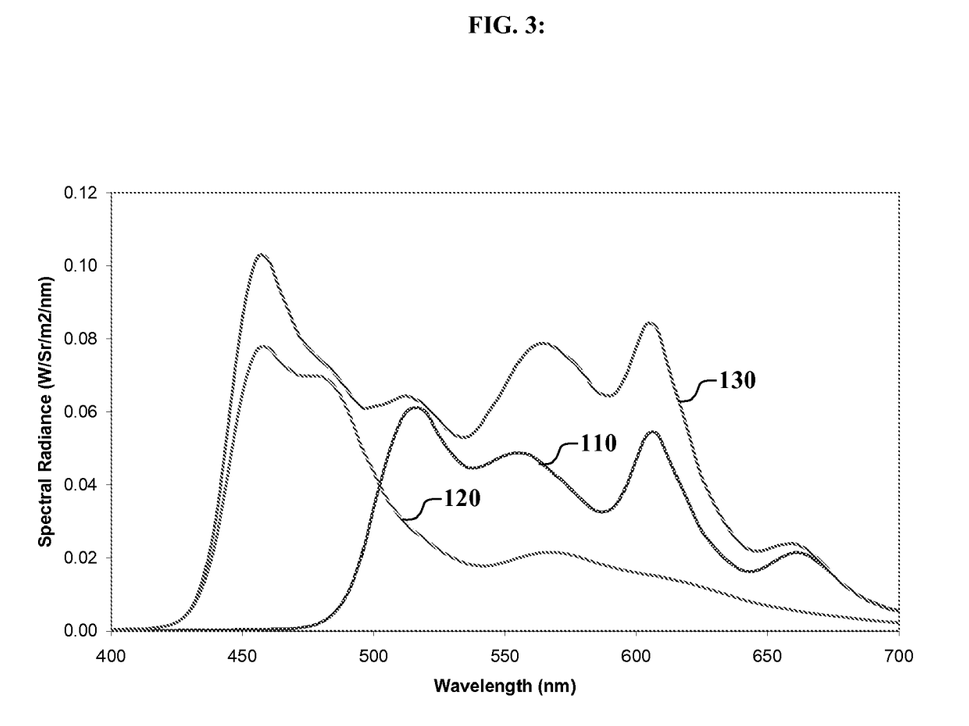
FIG. 3 shows a graph of emission luminance vs. wavelength for one embodiment of this invention.

Turning now to FIG. 3, there is shown a graph of emission luminance vs. wavelength for an embodiment of an OLED device represented in FIG. 2. Curve 110 shows the emission of the first light-emitting unit as described herein, while curve 120 shows the emission of the second light-emitting unit, showing that the units produce different emission spectra. The first light-emitting unit has substantially no emission in the blue region of the spectrum. That is, it produces light with multiple peaks at wavelengths longer than 500 nm, but substantially no emission at wavelengths shorter than 480 nm. One can see that the luminance of curve 110 at 490 nm is less than half of the maximum luminance, while that from 480 nm to 400 nm is less than 10% of the maximum luminance. Curve 110 has peaks in the green and red regions (near 515 nm and 670 nm, respectively). Curve 110 also has a peak in the yellow region (near 605 nm), which is also desirable in the first light-emitting unit.

Curve 120 shows the emission of the second light-emitting unit as described herein. The second light-emitting unit has substantial emission in the blue region, that is, at wavelengths shorter than 500 nm. As can be seen, the greatest luminance of the emission of curve 120 is between 400 nm and 500 nm.

Curve 130 shows the emission of the two light-emitting units when combined into a tandem OLED device according to this invention.

Light-emitting layers such as those described herein produce light in response to hole-electron recombination. Any suitable process such as evaporation, sputtering, chemical vapor deposition, electrochemical process, or radiation thermal transfer from a donor material can deposit desired organic light-emitting materials. Useful organic light-emitting materials are well known. As more fully described in U.S. Pat. Nos. 4,769,292 and 5,935,721, the light-emitting layers of the OLED device comprise a luminescent or fluorescent material where electroluminescence is produced as a result of electron-hole pair recombination in this region. The light-emitting layers can be comprised of a single material, but more commonly include a host material doped with a guest compound or dopant where light emission comes primarily from the dopant. The dopant is selected to produce color light having a particular spectrum. The host materials in the light-emitting layers can be an electron-transporting material, a hole-transporting material, or another material that supports hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material. Host and emitting molecules known to be of use include, but are not limited to, those disclosed in U.S. Pat. Nos. 4,768,292; 5,141,671; 5,150,006; 5,151,629; 5,294,870; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline and similar derivatives (Formula A) constitute one class of useful electron-transporting host materials capable of supporting electroluminescence, and are particularly suitable for light emission of wavelengths longer than 500 nm, e.g., green, yellow, orange, and red.

wherein:
M represents a monovalent, divalent, or trivalent metal;
n is an integer of from 1 to 3; and
Z independently in each occurrence represents the atoms completing a nucleus having at least two fused aromatic rings.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Benzazole derivatives constitute another class of useful host materials capable of supporting electroluminescence, and are particularly suitable for light emission of wavelengths longer than 400 nm, e.g., blue, green, yellow, orange or red. An example of a useful benzazole is 2,2',2"-(1,3,5-phenylene)tris[1-phenyl-1H-benzimidazole].

The host material in one or more of the light-emitting layers of the present invention can include an anthracene derivative having hydrocarbon or substituted hydrocarbon substituents at the 9 and 10 positions. For example, certain derivatives of 9,10-diarylanthracenes (Formula B) are known to constitute a class of useful host materials capable of supporting electroluminescence, and are particularly suitable for light emission of wavelengths longer than 400 nm, e.g., blue, green, yellow, orange or red wherein $R^1$, $R^2$, $R^3$, and $R^4$ represent one or more substituents on each ring where each substituent is individually selected from the following groups:

Group 1: hydrogen, or alkyl of from 1 to 24 carbon atoms;

Group 2: aryl or substituted aryl of from 5 to 20 carbon atoms;

Group 3: carbon atoms from 4 to 24 necessary to complete a fused aromatic ring of anthracenyl, pyrenyl, or perylenyl;

Group 4: heteroaryl or substituted heteroaryl of from 5 to 24 carbon atoms as necessary to complete a fused heteroaromatic ring of furyl, thienyl, pyridyl, quinolinyl or other heterocyclic systems;

Group 5: alkoxylamino, alkylamino, or arylamino of from 1 to 24 carbon atoms; and Group 6: fluorine, chlorine, bromine or cyano.

Particularly useful are compounds wherein $R^1$ and $R^2$ represent additional aromatic rings. Specific examples of useful anthracene materials for use as a host in a light-emitting layer include:

B1

B2

B3

B4

B5

B6

B7

Hole-transporting materials useful as hosts in light-emitting layers are well known to include compounds such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Klupfel et al. in U.S. Pat. No. 3,180,730 illustrate exemplary monomeric triarylamines. Other suitable triarylamines substituted with one or Brantley et al. in U.S. Pat. Nos. 3,567,450 and 3,658,520 disclose vinyl radicals or comprising at least one active hydrogen-containing group.

A more preferred class of aromatic tertiary amines are those which include at least two aromatic tertiary amine moieties as described in U.S. Pat. Nos. 4,720,432 and 5,061,569. Such compounds include those represented by structural Formula C.

C wherein:

$Q_1$ and $Q_2$ are independently selected aromatic tertiary amine moieties; and G is a linking group such as an arylene, cycloalkylene, or alkylene group of a carbon to carbon bond.

In one embodiment, at least one of Q1 or Q2 contains a polycyclic fused ring structure, e.g., a naphthalene. When G is an aryl group, it is conveniently a phenylene, biphenylene, or naphthalene moiety.

A useful class of triarylamines satisfying structural Formula C and containing two triarylamine moieties is represented by structural Formula D.

D where:

$R_1$ and $R_2$ each independently represent a hydrogen atom, an aryl group, or an alkyl group or $R_1$ and $R_2$ together represent the atoms completing a cycloalkyl group; and

$R_3$ and $R_4$ each independently represent an aryl group, which is in turn substituted with a diaryl substituted amino group, as indicated by structural Formula E.

E wherein $R_5$ and $R_6$ are independently selected aryl groups. In one embodiment, at least one of $R_5$ or $R_6$ contains a polycyclic fused ring structure, e.g., a naphthalene.

Another class of aromatic tertiary amines are the tetraaryldiamines. Desirable tetraaryldiamines include two diarylamino groups, such as indicated by Formula E, and linked through an arylene group. Useful tetraaryldiamines include those represented by Formula F.

F wherein:

each Are is an independently selected arylene group, such as a phenylene or anthracene moiety;

n is an integer of from 1 to 4; and

Ar, $R_7$, $R_8$, and $R_9$ are independently selected aryl groups.

In a typical embodiment, at least one of Ar, $R_7$, $R_8$, and $R_9$ is a polycyclic fused ring structure, e.g., a naphthalene.

The various alkyl, alkylene, aryl, and arylene moieties of the foregoing structural Formulae C, D, E, and F can each in turn be substituted. Typical substituents include alkyl groups, alkoxy groups, aryl groups, aryloxy groups, and halogens such as fluoride, chloride, and bromide. The various alkyl and alkylene moieties typically contain from 1 to about 6 carbon atoms. The cycloalkyl moieties can contain from 3 to about 10 carbon atoms, but typically contain five, six, or seven carbon atoms—e.g., cyclopentyl, cyclohexyl, and cycloheptyl ring structures. The aryl and arylene moieties are usually phenyl and phenylene moieties.

In addition to a host material as described above, green light-emitting layer 51g also includes a 2,6-diaminoanthracene light-emitting dopant, as represented by the formula below:

G wherein $d_1$, $d_3$-$d_5$, and $d_7$-$d_8$ can be the same or different and each represents hydrogen or an independently selected substituent and each h can be the same or different and each represents one or more independently selected substituents, provided that two substituents can combine to form a ring group and a-d, i, and j are independently 0-5. Such diaminoanthracenes have been described by Klubek et al. in U.S. application Ser. No. 11/668,515, the contents of which are incorporated by reference. The host material in green light-emitting layer 51g is desirably an anthracene host as described above.

Green light-emitting layer 51g can optionally include a small amount of a blue light-emitting compound as a stabilizer. The presence of a blue light-emitting compound, which is a higher-energy dopant, provides greater luminance stability to the green emission of 2,6-diaminoanthracene dopants, while maintaining good efficiency of the green light-emitting dopants. Blue light-emitting compounds can be those described below for blue light-emitting layer 50b.

A red-light-emitting compound such as used in red light-emitting layer 51r can include a diindenoperylene compound of the following structure H:

H wherein:

$X_1$-$X_{16}$ are independently selected as hydrogen or substituents that include alkyl groups of from 1 to 24 carbon atoms; aryl or substituted aryl groups of from 5 to 20 carbon atoms; hydrocarbon groups containing 4 to 24 carbon atoms that complete one or more fused aromatic rings or ring systems; or halogen, provided that the substituents are selected to provide an emission maximum between 560 nm and 640 nm.

Illustrative examples of useful red dopants of this class are shown by Hatwar et al. in U.S. Patent Application Publication No. 2005/0249972, the contents of which are incorporated by reference.

Other red dopants useful in the present invention belong to the DCM class of dyes represented by Formula I:

(Formula I)

wherein $Y_1$-$Y_5$ represent one or more groups independently selected from: hydro, alkyl, substituted alkyl, aryl, or substituted aryl; $Y_1$-$Y_5$ independently include acyclic groups or can be joined pairwise to form one or more fused rings; provided that $Y_3$ and $Y_5$ do not together form a fused ring.

In a useful and convenient embodiment that provides red luminescence, $Y_1$-$Y_5$ are selected independently from: hydro, alkyl and aryl. In U.S. Patent Application Publication 2005/0181232, structures of particularly useful dopants of the DCM class, are shown, the contents of which are incorporated by reference.

A light-emitting yellow compound such as used in yellow light-emitting layer 50y or 51y can include a compound of the following structures:

J1

J2 wherein $A_1$-$A_6$ and $A'_1$-$A'_6$ represent one or more substituents on each ring and where each substituent is individually selected from one of the following:

Category 1: hydrogen, or alkyl of from 1 to 24 carbon atoms;

Category 2: aryl or substituted aryl of from 5 to 20 carbon atoms;

Category 3: hydrocarbon containing 4 to 24 carbon atoms, completing a fused aromatic ring or ring system;

Category 4: heteroaryl or substituted heteroaryl of from 5 to 24 carbon atoms such as thiazolyl, furyl, thienyl, pyridyl, quinolinyl or other heterocyclic systems, which are bonded via a single bond, or complete a fused heteroaromatic ring system;

Category 5: alkoxylamino, alkylamino, or arylamino of from 1 to 24 carbon atoms; or Category 6: fluoro, chloro, bromo or cyano.

Examples of particularly useful yellow dopants are shown by Ricks et al.

A blue-light-emitting compound such as found in blue light-emitting layer 50b can include a bis(azinyl)azene boron complex compound of the structure K:

K wherein:

A and A' represent independent azine ring systems corresponding to 6-membered aromatic ring systems containing at least one nitrogen;

$(X^a)_n$ and $(X^b)_m$ represent one or more independently selected substituents and include acyclic substituents or are joined to form a ring fused to A or A';

m and n are independently 0 to 4;

$Z^a$ and $Z^b$ are independently selected substituents;

1, 2, 3, 4, 1', 2', 3', and 4' are independently selected as either carbon or nitrogen atoms; and provided that $X^a$, $X^b$, $Z^a$, and $Z^b$, 1, 2, 3, 4, 1', 2', 3', and 4' are selected to provide blue luminescence.

Ricks et al. supra disclose some examples of the above class of dopants.

Another class of blue dopants is the perylene class. Particularly useful blue dopants of the perylene class include perylene and tetra-t-butylperylene (TBP).

Another particularly useful class of blue dopants in this invention includes blue-emitting derivatives of such styrylarenes and distyrylarenes as distyrylbenzene, styrylbiphenyl, and distyrylbiphenyl, including compounds described in U.S. Pat. No. 5,121,029. Among such derivatives that provide blue luminescence, particularly useful are those substituted with diarylamino groups. Examples include bis[2-[4-[N,N-diarylamino]phenyl]vinyl]-benzenes of the general structure L1 shown below:

L1

[N,N-diarylamino][2-[4-[N,N-diarylamino]phenyl]vinyl]biphenyls of the general structure L2 shown below:

and bis[2-[4-[N,N-diarylamino]phenyl]vinyl]biphenyls of the general structure L3 shown below:

In Formulas L1 to L3, $X_1$-$X_4$ can be the same or different, and individually represent one or more substituents such as alkyl, aryl, fused aryl, halo, or cyaNo. In a preferred embodiment, $X_1$-$X_4$ are individually alkyl groups, each containing from one to about ten carbon atoms. Ricks et al (cited above) disclose a particularly preferred blue dopant of this class.

Other OLED device layers that can be used in this invention have been well described in the art, and OLED devices 10 and 15, and other such devices described herein, can include layers commonly used for such devices. OLED devices are commonly formed on a substrate, e.g. OLED substrate 20. Such substrates have been well described in the art. A bottom electrode is formed over OLED substrate 20 and is most commonly configured as an anode 30, although the practice of this invention is not limited to this configuration. When EL emission is viewed through the anode, the anode should be transparent, or substantially transparent, to the emission of interest. Common transparent anode materials used in the present invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides such as gallium nitride, and metal selenides such as zinc selenide, and metal sulfides such as zinc sulfide, are used as the anode. For applications where EL emission is viewed only through the cathode electrode, the transmissive characteristics of the anode are immaterial and any conductive material is used, regardless if it is transparent, opaque, or reflective. Example conductors for the present invention include, but are not limited to, gold, iridium, molybdenum, palladium, and platinum. Typical anode materials, transmissive or otherwise, have a work function no less than 4.0 eV. Any suitable process such as evaporation, sputtering, chemical vapor deposition, or electrochemical process can deposit desired anode materials. Anode materials can be patterned using well-known photolithographic processes.

Hole-transporting layer 40 can be formed and disposed over the anode. Any suitable process such as evaporation, sputtering, chemical vapor deposition, electrochemical process, thermal transfer, or laser thermal transfer from a donor material can deposit desired hole-transporting materials. Hole-transporting materials useful in hole-transporting layers include hole-transporting compounds described above as light-emitting hosts.

Electron-transporting layers 55 and 65 can contain one or more metal chelated oxinoid compounds, including chelates of oxine itself, also commonly referred to as 8-quinolinol or 8-hydroxyquinoline. Other electron-transporting materials include various butadiene derivatives as disclosed in U.S. Pat. No. 4,356,429 and various heterocyclic optical brighteners as described in U.S. Pat. No. 4,539,507. Benzazoles, oxadiazoles, triazoles, pyridinethiadiazoles, triazines, phenanthroline derivatives, and some silole derivatives are also useful electron-transporting materials.

An upper electrode most commonly configured as a cathode 90 is formed over the electron-transporting layer. If the device is top-emitting, the electrode must be transparent or nearly transparent. For such applications, metals must be thin (preferably less than 25 nm) or one must use transparent conductive oxides (e.g. indium-tin oxide, indium-zinc oxide), or a combination of these materials. Optically transparent cathodes have been described in more detail in U.S. Pat. No. 5,776,623. Evaporation, sputtering, or chemical vapor deposition can deposit cathode materials. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

In OLED devices such as those described herein, one of the electrodes is necessarily transmissive to visible light. The other electrode can be reflective. For example, in FIG. 2, the anodes are transmissive, while the cathode can be reflective. In such a structure, first light-emitting unit 85 is disposed closer to the reflective electrode than second light-emitting unit 75. As described by Boroson et al. in U.S. Patent Application Publication 2007/0001588, it can be particularly useful to place a red-to-green light-emitting unit (e.g. first light-emitting unit 85) in the range of 60-90 nm from a reflecting electrode, and a blue light-emitting unit (e.g. second light-emitting unit 75) in the range of 150-200 nm from the reflecting electrode.

OLED devices 10 and 15 can include other layers as well. For example, a hole-injecting layer 35 can be formed over the anode, as described in U.S. Pat. No. 4,720,432, U.S. Pat. No. 6,208,075, EP 0 891 121 A1, and EP 1 029 909 A1. An electron-injecting layer 60, such as alkaline or alkaline earth metals, alkali halide salts, or alkaline or alkaline earth metal-doped organic layers, can also be present between the cathode and the electron-transporting layer.

The invention and its advantages can be better appreciated by the following comparative examples. Examples 2 to 6 are representative examples of this invention, while Example 1 is a non-inventive tandem OLED example for comparison purposes. The layers described as vacuum-deposited were deposited by evaporation from heated boats under a vacuum of approximately $10^{-6}$ Torr. After deposition of the OLED layers each device was then transferred to a dry box for encapsulation. The OLED has an emission area of 10 mm². The devices were tested by applying a current of 20 mA/cm² across electrodes, except that the fade stability was tested at 80 mA/cm². The results from Examples 1 to 6 are given in Table 1. Example 7 comprises only the second light-emitting unit of Example 2. Example 8 comprises only the first light-emitting unit of Example 2. Examples 7 and 8 are provided for spectrum comparison. The emission spectra of Examples 2, 7, and 8 are presented as curves 130, 120, and 110, respectively, in FIG. 3.

Another useful measure is the color gamut that can be produced by an illuminant as described herein. The color gamut with three primary colors (the color-gamut-defining primaries) is represented by a triangle on the 1931 CIE x,y chromaticity diagram. One useful measure of the color gamut is the % NTSCx,y ratio, which is the ratio of the area of the triangle produce by a given set of red, green, and blue primary emitters to the area of the triangle produced by the NTSC reference red, green, and blue primaries. The NTSC reference primaries are defined in e.g. Fink, "Color Television Standards", McGraw-Hill, New York (1955). The spectral characteristics of the illuminants can be cascaded with the spectral transmittance of selected color filters, and with the 1931 CIE color matching functions, as described in "Colorimetry", CIE Publication 15:2004 3rd Edition, published by the CIE Central Bureau in Vienna, Austria. The result of this cascade is a set of chromaticity coordinates that pertains to a given illuminant on the 1931 CIE chromaticity diagram. The first set of color filters used for this cascade was obtained from a commercially available LCD television. The results are shown in Table 1 as the color gamut labeled "LCD filters". The second set of color filters used for this cascade was those described by U.S. Ser. No. 11/595,199. The results are shown in Table 1 as the color gamut labeled "narrowband filters".

EXAMPLE 1 (COMPARATIVE)

1. A clean glass substrate was deposited by sputtering with indium tin oxide (ITO) to form a transparent electrode of 60 nm thickness.
2. The above-prepared ITO surface was treated with a plasma oxygen etch.
3. The above-prepared substrate was further treated by vacuum-depositing a 10 nm layer of hexacyanohexaazatriphenylene (CHATP) as a hole-injecting layer (HIL).

CHATP

4. The above-prepared substrate was further treated by vacuum-depositing a 155 nm layer of 4,4'-bis[N-(1-naphthyl)-N-phenylamino]biphenyl (NPB) as a hole-transporting layer (HTL).
5. The above-prepared substrate was further treated by vacuum-depositing a 20 nm yellow light-emitting layer including 16 nm NPB (as host) and 4 nm 9-(2-naphthyl)-10-(4-biphenyl)anthracene (BNA) as a co-host with 2% yellow-orange emitting dopant diphenyltetra-t-butylrubrene (PTBR).

PTBR

6. The above-prepared substrate was further treated by vacuum-depositing a 30 nm blue light-emitting layer including 28 nm 2-phenyl-9,10-bis(2-naphthyl)anthracene (PBNA) host and 2 nm NPB co-host with 1% BEP as blue-emitting dopant.

BEP

7. A 40 nm mixed electron-transporting layer was vacuum-deposited, including 20 nm 4,7-diphenyl-1,10-phenanthroline (also known as bathophen or Bphen), 20 nm tris(8-quinolinolato)aluminum (III) (ALQ) as co-host, with 2% Li metal.
8. The above-prepared substrate was further treated by vacuum-depositing a 10 nm layer of CHATP as a p-type doped organic layer (HTL).
9. The above-prepared substrate was further treated by vacuum-depositing a 8 nm layer of NPB as a hole-transporting layer (HTL).
10. The above-prepared substrate was further treated by vacuum-depositing a 20 nm red light-emitting layer including 19.5 nm of NPB and 0.5 nm PTBR as a yellow-emitting dopant with 0.5% dibenzo{[f,f']-4,4'7,7'-tetraphenyl]diindeno-[1,2,3-cd:1',2',3'-lm]perylene (TPDBP) as a red emitting dopant.
11. The above-prepared substrate was further treated by vacuum-depositing a 15 nm green light-emitting layer including 12.7 nm PBNA, 2.3 nm NPB, and 0.3% diphenylquinacridone (DPQ) as green emitting dopant.
12. The above-prepared substrate was further treated by vacuum-depositing a 15 nm blue light-emitting layer including 20 nm PBNA host with 1.3% BEP as blue-emitting dopant.
13. A 35 nm mixed electron-transporting layer was vacuum-deposited, including 17.5 nm Bphen, 17.5 nm ALQ as co-host, with 2% Li metal.
14. A 100 nm layer of aluminum was evaporatively deposited onto the substrate to form a cathode layer.

EXAMPLE 2 (INVENTIVE)

1. A clean glass substrate was deposited by sputtering with ITO to form a transparent electrode of 60 nm thickness.
2. The above-prepared ITO surface was treated with a plasma oxygen etch.
3. The above-prepared substrate was further treated by vacuum-depositing a 10 nm layer of CHATP as an HIL.
4. The above-prepared substrate was further treated by vacuum-depositing a 130 nm layer of NPB as an HTL.
5. The above-prepared substrate was further treated by vacuum-depositing a 20 nm yellow light-emitting layer including 13 nm 9-(1-naphthyl)-10-(2-naphthyl)anthracene (NNA) as host and 7 nm NPB as a co-host with 2% yellow-orange emitting dopant PTBR.
6. The above-prepared substrate was further treated by vacuum-depositing a 10 nm spacer layer including 7.5 nm NNA and 2.5 nm NPB.
7. The above-prepared substrate was further treated by vacuum-depositing a 30 nm blue light-emitting layer including 30 nm NNA host with 3% [N,N-di-p-tolylamino][2-[4-[N,N-di-p-tolylamino]phenyl]vinyl]biphenyl as blue-emitting dopant.
8. A 40 nm mixed electron-transporting layer was vacuum-deposited, including 20 nm Bphen, 20 nm ALQ, with 2% Li metal, completing the second light-emitting unit.
9. The above-prepared substrate was further treated by vacuum-depositing a 10 nm layer of CHATP as a p-type doped organic layer (HIL).
10. The above-prepared substrate was further treated by vacuum-depositing a 5 nm layer of NPB as a hole-transporting layer (HTL).
11. The above-prepared substrate was further treated by vacuum-depositing a 16 nm red light-emitting layer including 12 nm of NPB and 4 nm NNA with 0.5% TPDBP as a red emitting dopant.
12. The above-prepared substrate was further treated by vacuum-depositing a 4 nm yellow light-emitting layer including 3 nm NNA as host and 1 nm NPB as a co-host with 2% yellow-orange emitting dopant PTBR.
13. The above-prepared substrate was further treated by vacuum-depositing a 40 nm green light-emitting layer including 37.6 nm PBNA, 2 nm 2,6-bis(diphenylamino)-9,10-diphenylanthracene as green emitting dopant, and 0.4 nm BEP as blue emitting dopant.
14. A 40 nm mixed electron-transporting layer was vacuum-deposited, including 20 nm Bphen, 20 nm ALQ as co-host, with 2% Li metal.
15. A 100 nm layer of aluminum was evaporatively deposited onto the substrate to form a cathode layer.

EXAMPLE 3 (INVENTIVE)

An OLED device was constructed as described above for Example 2 except that Step 7 was as follows:
7. The above-prepared substrate was further treated by vacuum-depositing a 30 nm blue light-emitting layer including 30 nm NNA host with 3% [N,N-di-p-tolylamino][2-[4-[N,N-di-p-tolylamino]phenyl]vinyl]biphenyl and 1% BEP as blue-emitting dopants.

EXAMPLE 4 (INVENTIVE)

An OLED device was constructed as described above for Example 2 except that Step 13 was as follows:
13. The above-prepared substrate was further treated by vacuum-depositing a 40 nm green light-emitting layer including 36.6 nm PBNA, 3 nm 2,6-bis(diphenylamino)-9,10-diphenylanthracene as green emitting dopant, and 0.4 nm BEP as blue emitting dopant.

EXAMPLE 5 (INVENTIVE)

An OLED device was constructed as described above for Example 2 except that Step 12 was as follows:
12. The above-prepared substrate was further treated by vacuum-depositing a 4 nm yellow light-emitting layer including 2 nm NNA and 2 nm NPB with 2% yellow-orange emitting dopant PTBR.

EXAMPLE 5 (INVENTIVE)

An OLED device was constructed as described above for Example 2 except that Step 12 was as follows:
12. The above-prepared substrate was further treated by vacuum-depositing a 4 nm yellow light-emitting layer including 1 nm NNA as host and 3 nm NPB as a co-host with 2% yellow-orange emitting dopant PTBR.

EXAMPLE 7 (SINGLE-STACK)

A single-stack OLED device comprising only the second light-emitting unit was constructed using Steps 1-8 and 15 above for Example 2, except that Step 8 was as follows:
8. A 30 nm mixed electron-transporting layer was vacuum-deposited, including 15 nm Bphen, 15 nm ALQ, with 2% Li metal.

EXAMPLE 8 (SINGLE-STACK)

A single-stack OLED device comprising only the first light-emitting unit was constructed using Steps 1 and 9-15 above for Example 2.

The results of testing these examples are shown in Table 1, below. The inventive examples (2 through 6) show, relative to the comparative example, improved luminance, luminance efficiency, power efficiency quantum efficiency, and fade stability. They further show similar color gamuts.

The invention has been described in detail with particular reference to certain preferred embodiments thereof, but it will be understood that variations and modifications can be effected within the spirit and scope of the invention.

TABLE 1

Device data measured at 20 mA/cm² (except fade data)

| Device # | Voltage | Cd/m² | Lum Efficiency (cd/A) | Power Efficiency (W/A) | CIEx | CIEy | lm/W | QE % | Color Gamut (% NTSCx,y ratio) - LCD filters | Color Gamut (% NTSCx,y ratio) - narrowband filters | Room Temp Fade Stability @ 80 mA/cm² (hrs to 50%) |
|---|---|---|---|---|---|---|---|---|---|---|---|
| Example 1 (Comparative) | 8.4 | 3068 | 15.3 | 0.160 | 0.306 | 0.343 | 5.7 | 7.0 | 65.5% | 102.6% | 495 |
| Example 2 (Inventive) | 9.3 | 4718 | 23.6 | 0.231 | 0.329 | 0.354 | 8.0 | 10.2 | 63.2% | 99.3% | 950 |
| Example 3 (Inventive) | 9.5 | 4285 | 21.4 | 0.210 | 0.336 | 0.357 | 7.1 | 9.3 | 61.9% | 97.9% | 950 |
| Example 4 (Inventive) | 9.4 | 4739 | 23.7 | 0.228 | 0.319 | 0.365 | 7.9 | 10.0 | 63.7% | 99.8% | 856 |
| Example 5 (Inventive) | 9.5 | 4747 | 23.7 | 0.233 | 0.324 | 0.366 | 7.9 | 10.3 | 62.7% | 99.7% | 796 |
| Example 6 (Inventive) | 9.5 | 4853 | 24.3 | 0.237 | 0.328 | 0.369 | 8.0 | 10.4 | 62.8% | 99.7% | 750 |

PARTS LIST

- 10 OLED device
- 15 OLED device
- 20 substrate
- 25r red color filter
- 25g green color filter
- 25b blue color filter
- 30 anode
- 30r anode
- 30g anode
- 30b anode
- 30w anode
- 35 hole-injecting layer
- 40 hole-transporting layer
- 45 hole-transporting layer
- 50y yellow light-emitting layer
- 50b blue light-emitting layer
- 51r red light-emitting layer
- 51y yellow light-emitting layer
- 51g green light-emitting layer
- 55 electron-transporting layer
- 60 spacer layer
- 65 electron-transporting layer
- 70 light-emitting unit
- 75 light-emitting unit
- 80 light-emitting unit
- 85 light-emitting unit
- 90 cathode
- 95 intermediate connector
- 110 curve
- 120 curve
- 130 curve

The invention claimed is:

1. A tandem OLED device having two spaced electrodes comprising:
   a) first and second light-emitting units that produce different emission spectra disposed between the electrodes, the first light-emitting unit produces light that has multiple peaks at wavelengths longer than 500 nm and substantially no emission at wavelengths shorter than 480 nm, and the second light-emitting unit produces light that has substantial emission at wavelengths shorter than 500 nm, wherein the first light-emitting unit produces light that has green, yellow, and red peaks, and wherein the second light emitting unit has a blue light emitting layer and one other light emitting layer which produces either green, yellow, or red emission; and
   b) an intermediate connector disposed between the light-emitting units.

2. The tandem OLED device of claim 1 wherein one of the spaced electrodes is reflective and the other is transmissive and the first light-emitting unit is disposed closer to the reflective electrode than the second light-emitting unit.

3. A tandem OLED device having two spaced electrodes comprising:
   a) first and second light-emitting units that produce different emission spectra disposed between the electrodes, the first light-emitting unit produces light that has multiple peaks at wavelengths longer than 500 nm and substantially no emission at wavelengths shorter than 480 nm, and the second light-emitting unit produces light that has substantial emission at wavelengths shorter than 500 nm, wherein the first light-emitting unit produces light that has green, yellow, and red peaks, and wherein the second light emitting unit has a blue light emitting layer and one other light emitting layer which produces either green, yellow, or red emission;

b) an intermediate connector disposed between each of the light-emitting units; and c) an array of at least three different color filters associated with the device that receives light from the light-emitting units, the bandpass of each of the color filters being selected to produce different colored light.

4. The tandem OLED device of claim 3 wherein the first light-emitting unit produces light that has green, yellow, and red peaks.

5. The tandem OLED device of claim 3 wherein one of the spaced electrodes is reflective and the other is transmissive and the first light-emitting unit is disposed closer to the reflective electrode than the second light-emitting unit.

6. The tandem OLED device of claim 5 wherein the second light emitting unit has a blue light emitting layer and one other light emitting layer which produces either green, yellow, or red emission.

7. The tandem OLED device of claim 6 further including a spacer layer disposed between the blue light emitting layer and the other light emitting layer.

8. A tandem OLED device having two spaced electrodes comprising:

a) first and second light-emitting units that produce different emission spectra disposed between the electrodes, the first light-emitting unit produces substantially no blue emission and has a first light-emitting layer that produces green emission, a second light-emitting layer that produces red emission, and a third light-emitting layer that produces yellow emission, wherein the first light-emitting layer includes:
   i) an anthracene host; and
   ii) a 2,6-diaminoanthracene light-emitting dopant;

b) the second light-emitting unit produces light that has substantial blue emission, wherein the second light emitting unit has a blue light emitting layer and one other light emitting layer which produces either green, yellow, or red emission; and c) an intermediate connector disposed between each of the light-emitting units.

9. The tandem OLED device of claim 8 further including a third light-emitting layer in contact with the first and second light-emitting layers and producing yellow emission.

* * * * *